United States Patent

Johnson et al.

[11] Patent Number: 5,868,852
[45] Date of Patent: Feb. 9, 1999

[54] PARTIAL CLEAN FLUORINE THERMAL CLEANING PROCESS

[75] Inventors: Andrew David Johnson, Doylestown; Richard Vincent Pearce, Kempton, both of Pa.; Charles Anthony Schneider, Gilbert; Timothy Wayne McGaughey, Phoenix, both of Ariz.

[73] Assignees: Air Products and Chemicals, Inc., Allentown, Pa.; Aspect Systems, Inc., Chandler, Ariz.

[21] Appl. No.: 801,330

[22] Filed: Feb. 18, 1997

[51] Int. Cl.$^6$ .................. B08B 6/00; C25F 1/00
[52] U.S. Cl. .................. 134/1.1; 216/60; 216/79
[58] Field of Search .................. 134/1.1, 1.3; 216/63, 216/79, 74, 60

[56] References Cited

U.S. PATENT DOCUMENTS

| | | | |
|---|---|---|---|
| Re. 30,505 | 2/1981 | Jacob | 156/643 |
| 4,374,698 | 2/1983 | Sanders et al. | 156/643 |
| 4,522,681 | 6/1985 | Gorowitz et al. | 156/643 |
| 4,568,410 | 2/1986 | Thornquist | 156/643 |
| 4,787,957 | 11/1988 | Barkanic et al. | 156/643 |
| 5,069,724 | 12/1991 | Kobayashi et al. | 134/37 |
| 5,254,176 | 10/1993 | Ibuka et al. | 134/2 |
| 5,294,262 | 3/1994 | Nishimura | 134/22.1 |
| 5,380,370 | 1/1995 | Niino et al. | 134/22.11 |
| 5,421,957 | 6/1995 | Carlson et al. | 216/58 |
| 5,637,153 | 6/1997 | Ninno et al. | 134/22.11 |

FOREIGN PATENT DOCUMENTS

| | | |
|---|---|---|
| 636707 | 2/1995 | European Pat. Off. . |
| 0731497 | 11/1996 | European Pat. Off. . |
| 05044035 | 2/1993 | Japan . |
| 2183204 | 3/1987 | United Kingdom . |

OTHER PUBLICATIONS

"Silicon Processing for the VLSI Era: vol. 1: Process Technology"; Wolf et al. ; Lattice Press; Sunset Beach, Ca; © 1986; ISBN: 0–961672–3–7; p. 567.

"In Situ Cleaning of Silicon Nitride ($Si_3N_4$) Process Quartzware Using a Thermal Nitrogen Trifluoride ($NF_3$) Etch Process", Sematech Technology Transfer 96083161A–TR (Sep. 30, 1996) by A. D. Johnson, et al.

Primary Examiner—R. Bruce Breneman
Assistant Examiner—George Goudreau
Attorney, Agent, or Firm—Geoffrey L. Chase

[57] ABSTRACT

A method for the dynamic cleaning of semiconductor fabrication equipment and particularly quartzware with a thermally activated source of fluorine, such as nitrogen trifluoride, at an elevated temperature, typically at the process operation temperature, wherein the cleaning is terminated prior to complete cleaning and removal of undesired substances allowing rapid restart of fabrication equipment so cleaned.

11 Claims, 3 Drawing Sheets

5,868,852

PARTIAL CLEAN FLUORINE THERMAL CLEANING PROCESS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention is directed to the field of thermal cleaning with nitrogen trifluoride and similar fluorine sources. More specifically, the present invention is directed to cleaning various silicon-containing semiconductor substances from wafers and chemical vapor deposition equipment, including reaction vessels and hardware, using a dynamic flow of nitrogen trifluoride at elevated temperatures with a unique partial clean process.

The semiconductor industry has experienced a long-felt need to solve the problem of cleaning chemical vapor deposition furnaces and quartz tubes in the furnaces as well as quartz hardware of various undesired substances, such as silicon nitride, polycrystalline silicon, titanium silicide, tungsten silicide and various other silicides, as well as silicon dioxide, which are typically present as undesired films on furnaces and quartz hardware during their deposition on silicon wafers and chips being processed as electronic materials and integrated circuits.

The normal procedure for cleaning is to remove the parts, such as those made of quartz, metals or other materials from a furnace, such as quartz furnace tubes, and perform a wet chemical cleaning. O-ring seals would typically have to be replaced in such an operation, as well as cleaning of lines, doors and other vacuum components. The wet chemical cleaning is very costly and time consuming. When the equipment is shut down to pull the quartz parts, it can require up to 18 hours of time. Also, the system necessitates reverification for its operating integrity before it can be used again. The wet chemical cleaning application requires special chemicals, equipment and sinks to perform this cleaning. Another disadvantage is that the quartzware is attacked at accelerated rates which affects its reproducibility and reliability of operation. This is especially true when cleaning quartz racks or wafer holders. These components have special slots cut in the quarts to hold the parts being coated, and when the wet chemical clean attacks the quartz, it affects the dimensions of these slots. When the slots are affected, the parts being held are not coated uniformly, which requires the quartz be replaced at accelerated scheduling.

Another alternative is plasma cleaning. The plasma cleaning method requires the use of another piece of equipment especially designed to perform a cleaning of quartz tubes in place within the chemical vapor deposition furnace equipment. First, the plasma cleaning method does not clean the other quartz parts which are used in the chemical vapor deposition furnace system. This means these parts will need to be chemically wet cleaned, separate and apart from plasma cleaning methods. Also, the plasma cleaning equipment takes up space in the manufacturing area, and may prevent other tubes from being used in the system while it is being utilized. If the quartz parts are replaced with another material like silicon carbide, it will make the plasma system application unreliable.

Methods of using nitrogen trifluoride have been attempted but never have been brought to the marketplace. One such method was performed in a static mode that allowed by-products to condense on the cooler walls of the system. This caused a dangerous condition when these by-products were not evacuated before returning the system to the atmosphere. This called for extended purging times and reduced the benefits of this method. It also allowed for possible dangerous gas mixtures to develop in the system's vacuum components that may mix with gases which are normally utilized to deposit films on the wafers.

One nitrogen trifluoride cleaning method is discussed in UK Patent Appln. GB2183204 where nitrogen trifluoride is used in a static mode and suggestion for use in a continuous flowing mode is also set forth. This patent application does not address the means or methods for removing cleaning by-products, the treatment of by-products once removed, the extent of clean or the use of nitrogen trifluoride with any other gases.

U.S. Pat. No. 5,421,957 discloses a nitrogen trifluoride cleaning process for semiconductor process reactors and apparatus by controlling the moisture content during the clean operation to be less than 10 parts per million by volume. Inert carrier gases for the nitrogen trifluoride are disclosed such as nitrogen, helium, argon or the like. The concentration of the inert was from 95.5% to 80% of the etchant mixture.

U.S. Reissue Patent No. 30,505 discloses a process for plasma etching of a solid material with a binary mixture comprising essentially oxygen and a halocarbon wherein at least one carbon atom in said molecule is linked to a predominance of fluorine atoms. At the temperatures recited (25°–300° C.) there is no reaction between the binary gas mixture and the solid material to be etched. Temperatures in excess of 1000° C. are necessary to thermally dissociate halocarbons, making this gas impractical for thermal cleaning of semiconductor process equipment.

U.S. Pat. No. 4,374,698 describes an etch process for differential etching of silicon nitride from silicon dioxide using the combination of carbon tetrafluoride and a halofluorocarbon. The gas etchant may include oxygen or nitrous oxide. A plasma is necessary to dissociate the halocarbon into species that will react with the solid material. The role of the oxygen source in this patent is to volatilize the carbon products into CO and $CO_2$. Without oxygen, this process would coat the process equipment with teflon-like material, defeating the usefulness of the process for cleaning.

U.S. Pat. No. 4,522,681 discloses a method for etching holes in silicon dioxide wherein a dry plasma etch gas of argon, nitrogen trifluoride and oxygen may be used. Polymeric photoresist materials such as polymethyl methacrylate, ethyl methacrylate, methyl isopropyl ketone as well as copolymers thereof with methacrylic acid may be used. This class of photoresist materials was required, versus standard novel AC photoresists, to successfully practice the invention. Plasma is necessary to dissociate the fluorine compound into specie that will etch the substrate. The role of the oxygen is to etch the photoresist and not the substrate.

U.S. Pat. No. 4,568,410 discloses a dry plasma etch process for etching silicon nitride using nitrogen trifluoride and oxygen. Good results for etching silicon nitride were found with relative percentages of the nitrogen trifluoride to oxygen recited at column 5, line 65 to be 10–20 SCCM of $NF_3$ in comparison to 20–35 SCCM for oxygen. The gases are also disclosed as capable of etching common resists.

U.S. Pat. No. 4,787,957 is directed to a method for plasma desmear and etchbac of epoxy and polyimide materials from a multilayered or double sided printed circuit board using a plasma gas composition in the range of 20–45% NF$_3$, the remainder being O$_2$.

EP Application 0 731 497 A2 discloses a thermal clean with diluted nitrogen trifluoride and means for removing the cleaning by-products.

Various chlorine trifluoride cleaning processes are known such as are disclosed in U.S. Pat. Nos. 5,254,176; 5,294,262; 5,380,370; and 5,069,724.

In the article "In Situ Cleaning of Silicon Nitride (Si$_3$N$_4$) Process Quartzware Using a Thermal Nitrogen Trifluoride (NF$_3$) Etch Process", SEMATECH Technology Transfer 96083161A-TR (9/30/96) by A. D. Johnson, et al., a thermal cleaning process using nitrogen trifluoride is disclosed. The article suggests the use of complete cleans.

The prior art has failed to address a commercially successful process for cleaning semiconductor materials or equipment using a gaseous source to produce volatile cleaning by-products which are readily removed from the materials or equipment after cleaning is accomplished. In addition, the prior art has not addressed a viable method for thermal cleaning with fluorine sources in which minimal start-up time is required to re-initiate the production process in the cleaned equipment. The present invention as set forth below overcomes these drawbacks of the prior art.

BRIEF SUMMARY OF THE INVENTION

The present invention is a thermal process using a source of fluorine for cleaning equipment surfaces in semiconductor manufacturing equipment used to process semiconductor materials, comprising:

(a) initially evacuating a zone contacting the equipment surfaces;

(b) maintaining the zone at an elevated temperature sufficient to thermally dissociate the source of fluorine;

(c) flowing the source of fluorine through the zone;

(d) partially cleaning undesired substances on the equipment surfaces by chemical reaction of the source of fluorine and/or fluorine cleaning reagents dissociated from the source of fluorine with the substances to form volatile reaction products;

(e) terminating the cleaning prior to complete removal of the undesired substances from the equipment; and (f) initiating the processing of semiconductor materials in the partially cleaned equipment.

Preferably, the elevated temperature of step (b) is in the range of approximately 300° to 1000° C.

More preferably, the elevated temperature of step (b) is in the range of approximately 400° to 700° C.

Most preferably, the flow of the source of fluorine is in the range of approximately 1 to 20 standard liters per minute ("SLM").

Preferably, the source of fluorine is selected from the group consisting of nitrogen trifluoride, chlorine trifluoride, fluorine, sulfur hexafluoride, carbon tetrafluoride and mixtures thereof.

Preferably, an inert gas selected from the group consisting of nitrogen, argon, helium and mixtures thereof is used with the source of fluorine as an etchant mixture.

Preferably, the initial evacuation is at a pressure of no greater than 600 torr, the flow of the source of fluorine is at a pressure of no greater than 750 torr and the heating is at a temperature of no greater than 400°–700° C.

Preferably, the source of fluorine is nitrogen trifluoride which is present in the range of approximately 1 to 50% by volume of the etchant mixture.

Preferably, the undesired substances are selected from the group consisting of silicon nitride, siliconoxynitride, silicon dioxide, polysilicon and mixtures thereof.

Preferably, the volatile reaction products are monitored to detect an increase in said source of fluorine and said partial clean is terminated when said increase is detected.

Alternatively, the volatile reaction products are monitored to detect an increase in silicon tetrafluoride and said partial clean is terminated when said increase is detected.

Preferably, the increase of nitrogen trifluoride or silicon tetrafluoride has a magnitude of no greater than 20% by volume.

DETAILED DESCRIPTION OF THE INVENTION

Figure 1:
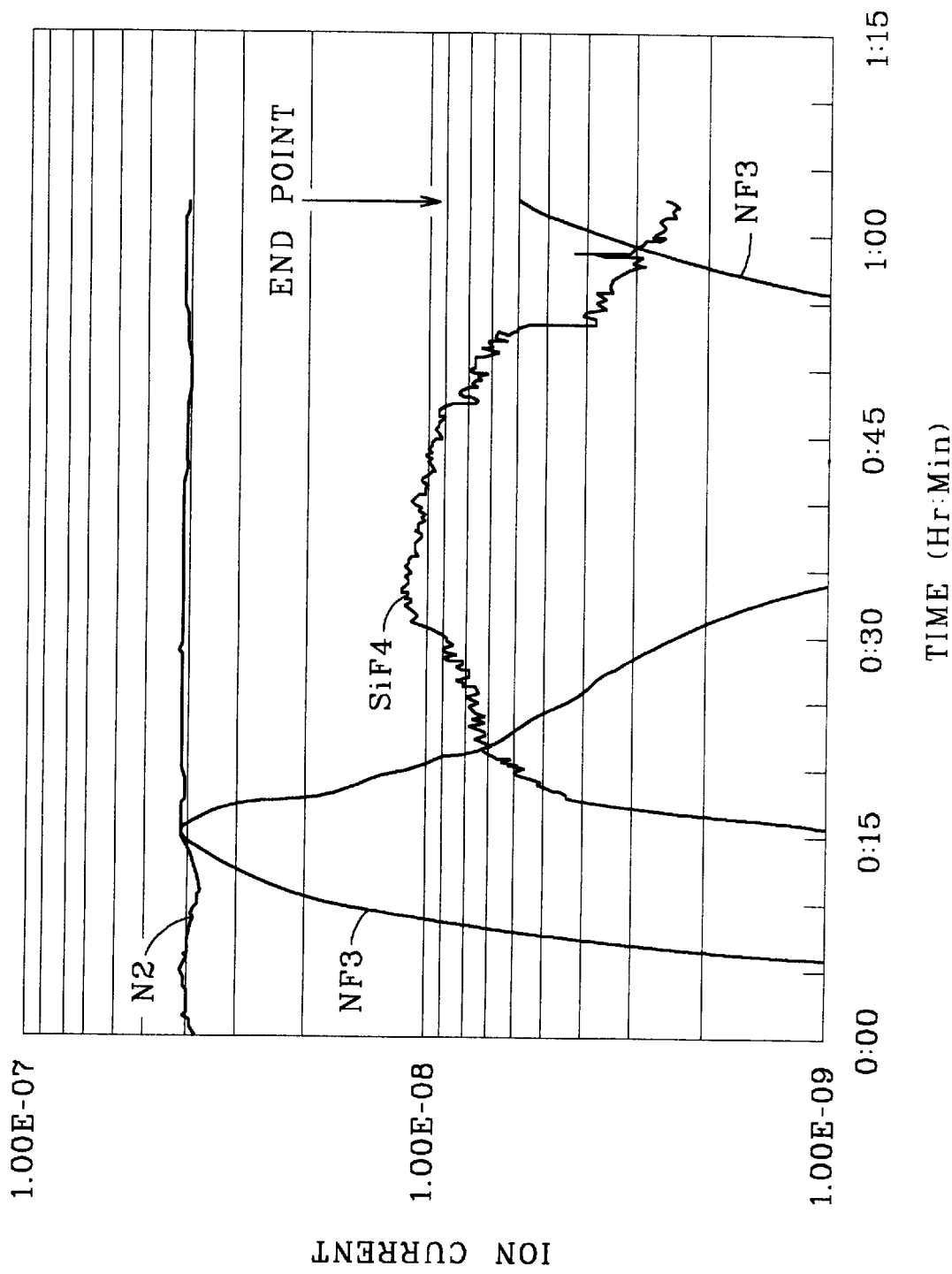
FIG. 1 is a graph of nitrogen trifluoride, silicon tetrafluoride and nitrogen during a nitrogen trifluoride complete clean not using the process of the present invention. The graph is clean time vs. ion content from the clean zone. The etch was at a pressure of 500 torr, 550°–600° C., 30% nitrogen trifluoride in nitrogen and a flow of 5.0 standard liters per minute.

In semiconductor manufacturing, low pressure chemical vapor deposition (LPCVD) is used to deposit thin films of semiconductor materials (e.g. Si$_3$N$_4$, polysilicon, SiO$_2$). Material is deposited not only on the silicon wafer, but also on the walls of the quartz-vacuum process chamber and appliances. After a cumulative deposition to a thickness of approximately 20 µm on the chamber walls, this material needs removing to preempt particle shedding.

It is not sufficient to simply remove the chemical vapor deposition (CVD) material from the reactor walls. Once the reactor is clean, the CVD process must be requalified. In particular, the deposition rate must be within specified limits before the furnace can run product. Extensive requalification is unacceptable. The prior thermal NF3 clean process removes all of the CVD material, to expose the underlying quartz tube. Following this complete clean, a lengthy coat run is necessary before the deposition rate meets specifications. The present inventors find that by leaving some CVD material on the tube, the subsequent coat and requalification time is much shorter. The idea for a partial clean is distinct because the prior art is unaware that exposing the quartz tube to reactive fluorine impedes CVD recovery. Preferably, the partial clean is performed to reduce the undesired substances or CVD materials on the equipment surfaces but not expose the equipment surfaces. More preferably, the partial clean is performed to reduce the undesired substances or CVD materials on the equipment surfaces to less than 5 µm.

Alternatively, the partial clean is performed to remove the undesired substances or CVD materials from some but not all equipment surfaces.

Although not wanting to be held to any particular theory, the present inventors believe that when the prior full clean is performed, fluorine is incorporated into the process chamber walls and the surfaces of any appliance in the process chamber. When requalification of the process chamber is conducted to re-initiate processing of semiconductor materials on commercial production runs, the fluorine in the process chamber walls and surfaces interacts with the process chemistry and precludes rapid requalification until the fluorine is removed, coated over or deactivated in some way. It is possible that the fluorine captured in the silica of the quartz process chambers and appliances outgasses during subsequent process runs and must be removed by further outgassing in subsequent qualifying runs or coated and made inaccessible by the chemistry of the qualifying process runs.

A process has been developed for in-situ thermal cleaning of equipment such as process chambers, boats and/or tool pieces in a semiconductor electronic fabrication facility using a source of fluorine, such as nitrogen trifluoride, chlorine trifluoride, sulfur hexafluoride, carbon tetrafluoride and mixtures thereof at elevated temperature. The present invention achieves rapid re-initiation of the semiconductor material processing in the cleaned process chamber because of the retention of some of the material that is otherwise removed during the clean. The presence of these otherwise undesired substances provides for rapid re-initiation of the semiconductor material processing without the delays of the prior art clean processes.

The present invention reduces the cost to clean commonly used quartzware parts and metal roughing lines used in semiconductor and electronic manufacturing equipment by allowing their surfaces to be cleaned in-situ without removal of such surfaces from the process system and without significant reduction in the temperature that the equipment operates at under normal manufacturing operation and by reducing the time required to effect cleaning.

This rapid in situ clean and rapid re-initiation and recalibration of cleaned process equipment and chambers is possible with the partial clean process of the present invention.

This is a significant benefit because process equipment downtime is critical to economic operation and having to include an extended re-initiation time for product processing after cleaning is undesirable.

The present invention does not require a retrofit that utilizes a radio frequency power supply and means of applying radio frequency to surfaces for activation energy to decompose nitrogen trifluoride to produce cleaning reagent such as required in plasma processes. The present invention also eliminates the use of other equipment used for current methods of cleaning, such as to remove quartzware or roughing lines for cleaning in aqueous acids and deionized water in large, semi-automated ventilated tanks. The present invention eliminates what chemical wastes and possible operator exposure to hazardous acids and solvents used in current cleaning systems.

The present invention involves thermally cleaning a typical process chamber including the parts arrayed within a chamber of a semiconductor or electronic fabrication facility by evacuating the chamber. A source of fluorine such as nitrogen trifluoride, preferably diluted with an inert gas such as nitrogen, argon, helium or mixtures thereof to provide an etchant mixture is then introduced via a gas supply means, such as a gas control manifold, into the process chamber and associated roughing manifold and the cleaning process is conducted at a pressure in the range of about 400–750 torr using the thermal energy of approximately 300° to 1000° C., preferably 400° to 700° C., available from the existing equipment heating system to decompose or dissociate the nitrogen trifluoride and produce a fluorine cleaning reagent, such as ionic, atomic or free fluorine. The fluorine cleaning reagent produced from the decomposition or disassociation of nitrogen trifluoride under thermal degradation are effective against deposits of undesired substances or CVD material, such as; silicon nitride, siliconoxynitride, silicon dioxide, polycrystalline silicon, titanium silicide, tungsten silicide, refractory metals and their various silicides. The fluorine cleaning reagent produced from the decomposition or disassociation of nitrogen trifluoride has minimal effect on quartz tube furnaces or quartzware used within such furnaces.

It has been determined that as the cleaning nears completion, an increase in the source of fluorine or nitrogen trifluoride is sensed in the outlet or effluent from the process chamber being cleaned. Silicon tetrafluoride, a by-product of the cleaning process as a volatile reaction product, sensed in the outlet or effluent of the process chamber being cleaned decreases as the clean nears completion. Therefore, it is possible to determine when the clean nears completion but is still incomplete, leaving residual undesired substances on the equipment being processed, i.e., a partial clean. Upon partial completion of the cleaning process, the nitrogen trifluoride source is turned off and the system pumped under vacuum, preferably with heated and temperature controlled pressurized gas, for 15 minutes followed by a purge with nitrogen for at least one-half hour while under vacuum. Preferably, when an increase in 20% by volume of the source of fluorine is sensed in the effluent the partial clean is terminated. More preferably when an increase of 10% by volume is sensed the partial clean is terminated. Similarly, when a decrease of 20% by volume of the silicon tetrafluoride is sensed in the effluent, the partial clean is terminated. More preferably, when a decrease of 10% by volume of the siicon tetrafluoride is sensed in the effluent the partial clean is terminated. Alternatively, a partial clean can be accomplished by calibrating the requirement to achieve a fulf clean for a given undesired substance in a given furnace at identified conditions and thereafter performing the clean for a lesser period of time to accomplish the partial clean with or without monitoring of the source of fluorine or the silicon tetrafluoride.

After the partial clean of the present invention, the process chamber, appliances and system must be requalified for commercial processing or manufacture of semiconductor materials such as silicon wafers. In particular, the deposition rate, film composition, particles and metal contamination must be within specifications before the process chamber can again perform commercial processing. It is this critical and mandatory requalification that the partial clean process of the present invention provides a dramatic improvement over the full cleans of the prior procedures as set forth in comparative data analysis set forth in the examples and the figures as discussed below.

This invention enhances the thermal $NF_3$ and other fluorine source processes used to clean low pressure chemical vapor deposition (LPCVD) $Si_3N_4$ and polysilicon film deposition tubes. The current process uses a $NF_3(30\%)/N_2$ gas mixture at a temperature of 500° C. to 600° C. and a pressure of 400 to 600 torr. The stoichiometry of the overall reaction that removes the $Si_3N_4$ film is:

$$Si_3N_4 + 4NF_3 \rightarrow 3SiF_4 + 4N_2$$

and for the polysilicon film is:

$$3Si + 4NF_3 \rightarrow 3SiF_4 + 2N_2$$

Because $NF_3$ and $SiF_4$ are, respectively, etch reactant and volatile reaction by-products, the $Si_3N_4$ etch rate is directly proportional to the $NF_3$ and $SiF_4$ partial pressure in the effluent of the process chamber being cleaned.

During the course of chemical vapor deposition of materials in the quartz tubes, deposition occurs on various appliances and carriers within the quartz tubes, as well as on the quartz tube surfaces themselves. At some point in time one or more of the appliances and/or tubes must be taken out of service for cleaning. Although in the present illustration, the cleaning process will be exemplified by all of the quartz tubes being cleaned simultaneously, it is understood by appropriate manifolding, a quartz tube or appliances may be independently or separately cleaned, while other tubes remain in service.

EXAMPLE 1

The prior in situ clean was run using a NF3(30%)/N2 gas mixture at a temperature of 500° to 600° C. and a pressure of 500 torr. Quadrupole mass spectrometry (QMS) was used as an in situ process monitor during the experiments herein. The QMS profile in FIG. 1 shows that when all of the $Si_3N_4$ has been cleaned from the quartz tube, the $NF_3$ pressure increases by a factor of 100, indicating end point (60 min.). At this point, the quartz tube is determined to be clean by visual inspection. In this example of a complete clean, the $NF_3$(30%)/N2 gas flow was 5.0 SLM and the pressure was 500 torr. The temperature at the start of the clean was 600° C., but this was ramped down to 450° C. when the $NF_3$ was turned on.

EXAMPLE 2

Figure 2:
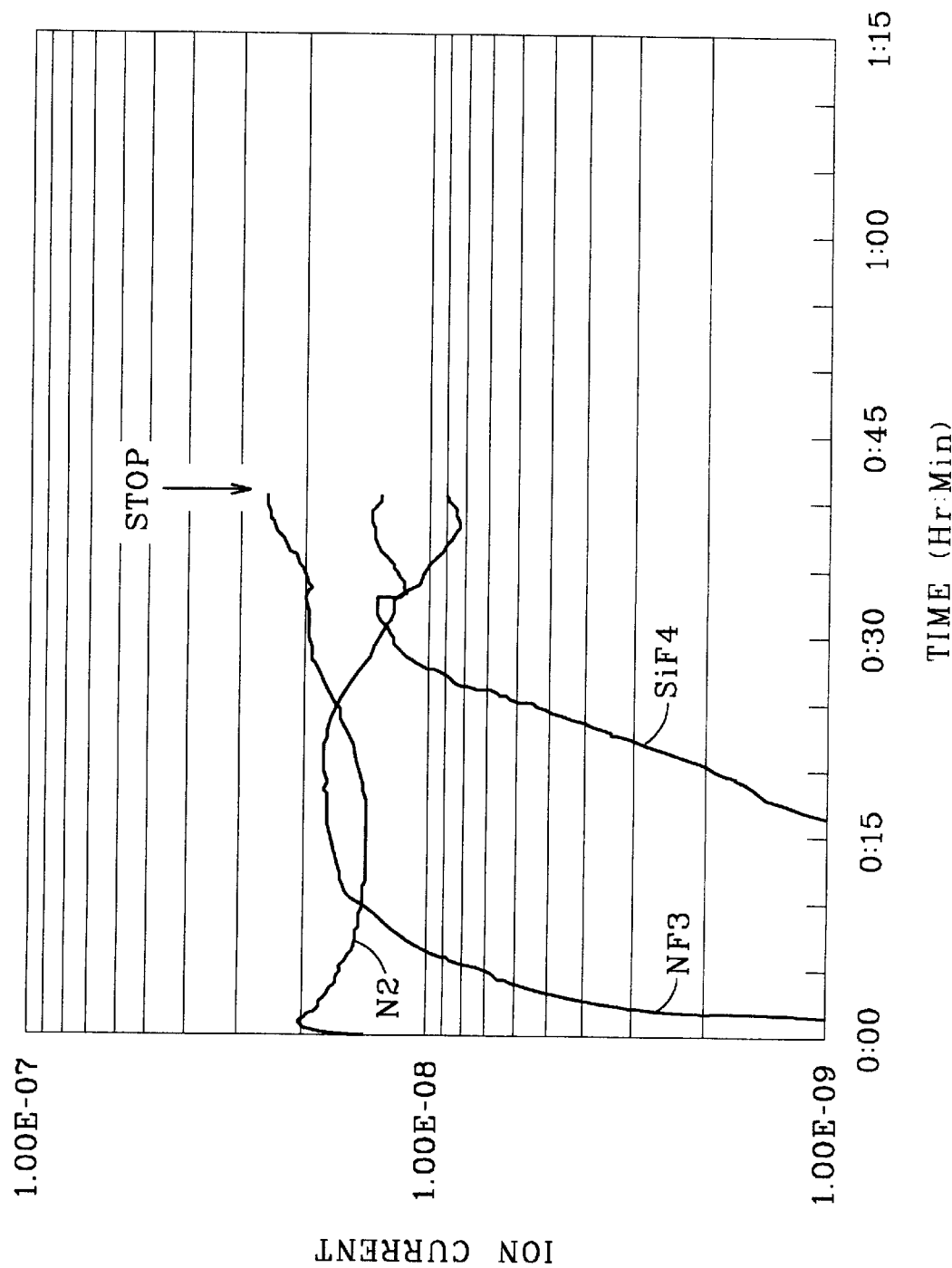
FIG. 2 is a graph of nitrogen trifluoride, silicon tetrafluoride and nitrogen during a nitrogen trifluoride partial clean using the process of the present invention. The graph is clean time vs. ion content from the clean zone. The etch was at a pressure of 500 torr, 600° C., 30% nitrogen trifluoride in nitrogen and a flow of 5.0 standard liters per minute.

FIG. 2 shows the QMS profile during a partial clean of 4 $\mu m$ $Si_3N_4$. A $NF_3$(30%)/$N_2$ gas flow of 5 SLM was used at a temperature and pressure of 600° C. and 500 torr, respectively. The QMS profile shows that the etch was stopped after 39 min and before end point (decrease in SiF4 pressure, or, increase in $NF_3$ pressure). A visual inspection confirmed that a thin $Si_3N_4$ film remained along the quartz tube.

EXAMPLE 3

Figure 3:
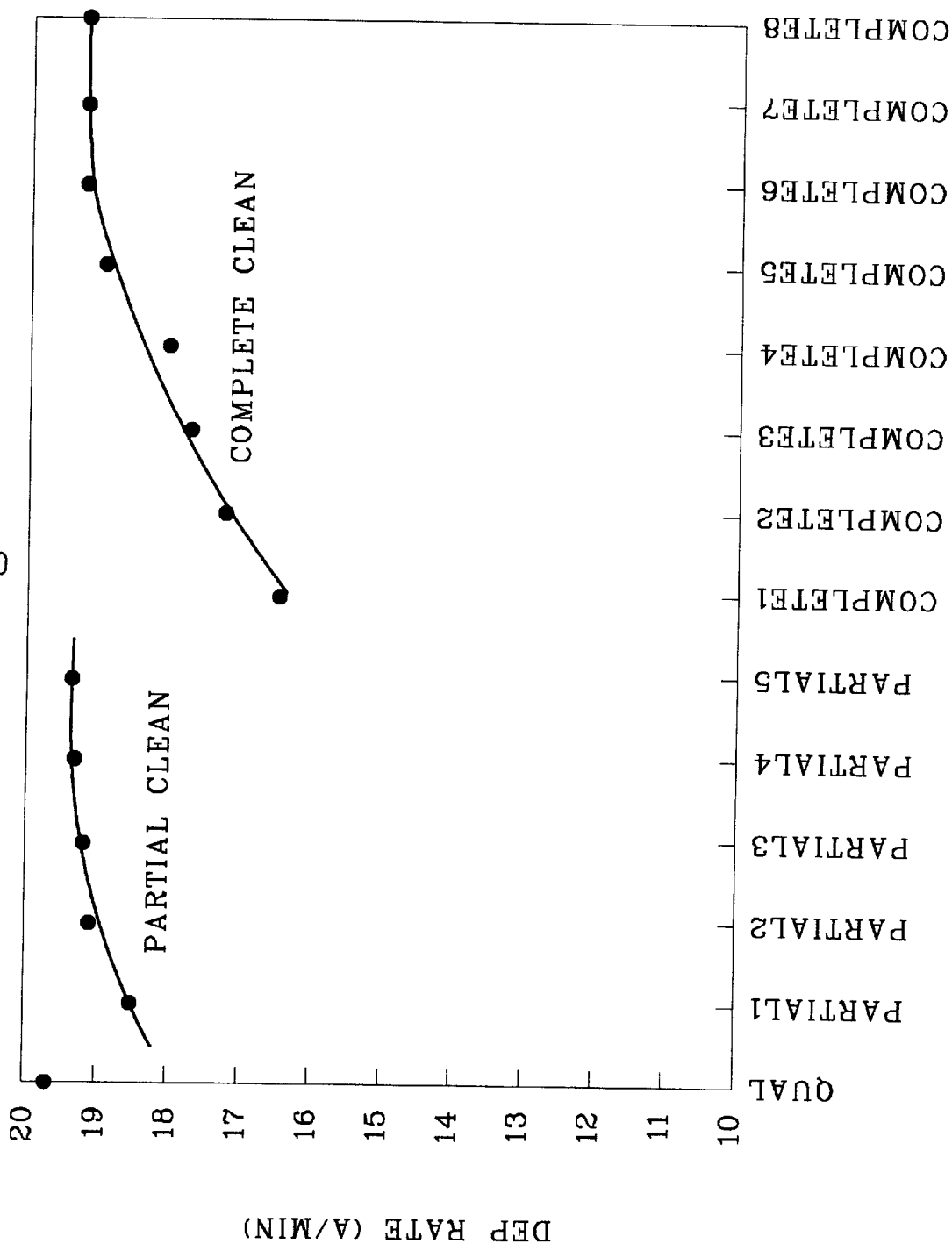
FIG. 3 is a graph of deposition rate in Å/min of a semiconductor process furnace for Si$_3$N$_4$ deposition after full clean using nitrogen trifluoride, but without the technique of the present invention and partial clean using nitrogen trifluoride with the technique of the present invention. Partial clean provides rapid return to requalification and semiconductor processing at the required rate, in contrast to full clean.

Once the reactor is clean, the CVD process needs requalifying. In particular, the deposition rate must be within specified limits before the furnace can run product. FIG. 3 shows the $Si_3N_4$ deposition rate following thermal $NF_3$ cleaning. The LPCVD recipe uses a 4:1 mix of $NH_3$:DCS at 250 mtorr and 750° C. When all of the $Si_3N_4$ is removed, i.e., Example 1 full clean, it takes 8 runs before the system meets specification (19.4 A/min.). Each run was of 25.75 min. duration to deposit approximately 500 A of LPCVD $Si_3N_4$. The $Si_3N_4$ deposition rate following the partial clean of Example 2 is also plotted in FIG. 3. When $Si_3N_4$ is left on the quartz tube (i.e., a partial clean per Example 2), the deposition rate recovers after only 3 runs. Each run was of 25.75 min. duration to deposit approximately 500 A of LPCVD $Si_3N_4$. The data point at the y-axis represents the deposition rate of the qualified process chamber prior to either the full clean or the partial clean.

This invention partially cleans the LPCVD tube of semiconductor material. By leaving a thin (<1 $\mu m$) $Si_3N_4$ film, the underlying quartz is not exposed to reactive fluorine. By not exposing the quartz tube to reactive fluorine, the deposition rate of the LPCVD process returns to its qualified value faster. The prior art is unaware that exposing the quartz tube to reactive fluorine (i.e., through a long over etch) impedes recovery of the LPCVD process.

Having described the present invention with regard to a preferred embodiment, it is apparent that the partial clean process of the present invention provides a number of benefits over the prior art, including: using thermal activation with heat sources typically already in place in quartz tube furnaces; avoidance of requirements for energy sources of plasma systems, the ability to clean system components in place; reduction in maintenance down time for cleaning; lower cost of cleaning and capital investment to effect appropriate cleaning procedures; the elimination of wet chemical cleaning materials and procedures; providing a cleaning method which does not require recalibration of the process chamber or furnace of the semiconductor fabrication facility prior to reinitiation of production runs; provision of a safe method for cleaning; providing a beneficial method of cleaning system quartzware and boats with minimal damage and handling; providing a method to insure fast by-product removal and economic cleaning process cycles, rapid re-initiation of the semiconductor materials processing after partial clean at required levels and providing a method which allows for rapid initiation of the clean or etch process at commercially attractive rates. In addition, the cleaning method of the present invention can be used to clean other types of process equipment, including stand alone cleaning equipment, stainless steel door flanges, vacuum conduits, exhaust piping, equipment of stainless steel, aluminum and ceramic, etc.

In addition, the total time required to be off-line from process operation is shorter using the partial clean of the present invention, because of the elimination or significant reduction in the lengthy time to recalibrate the process furnace for semiconductor material processing at design specifications. Maintaining a furnace at or near steady-state temperatures is also more advantageous for the useful life of an expensive quartz furnace tube, wherein the stress of significant temperature changes is avoided.

The present invention has been described with reference to a preferred embodiment, however, it should be appreciated that the full scope of the present invention should be ascertained from the claims which follow.

We claim:

1. A thermal process using a source of fluorine for cleaning equipment surfaces in semiconductor manufacturing equipment used to process semiconductor materials, comprising:

(a) initially evacuating a zone contacting said equipment surfaces;

(b) maintaining said zone at an elevated temperature sufficient to thermally disassociate the source of fluorine;

(c) flowing the source of fluorine through the zone wherein said source of fluorine comprises an etchant mixture of nitrogen trifluoride and an inert gas selected from the group consisting of nitrogen, argon, helium and mixtures thereof and said nitrogen trifluoride is present in the range of 1 to 50% by volume of said etchant mixture;

(d) partially cleaning undesired substances on said equipment surfaces by chemical reaction of said source of fluorine and/or fluorine cleaning reagents disassociated from said source of fluorine with said undesired substances to form volatile reaction products;

(e) terminating the cleaning prior to complete removal of said undesired substances from the equipment; and (f) initiating the processing of semiconductor materials in the partially cleaned equipment.

2. The process of claim 1 wherein said elevated temperature of step (b) is in the range of 300° C. to 1000° C.

3. The process of claim 1 wherein said elevated temperature of step (b) is in the range of 400° C. to 700° C.

4. The process of claim 1 wherein flow of said source of fluorine is in the range of 1 to 20 standard liters per minute.

5. The process of claim 1 wherein said initial evacuation is at a pressure of no greater than 600 torr, said flow of a source of fluorine is at a pressure of no greater than 750 torr and said heating is at a temperature of 400°–700° C.

6. The process of claim 1 wherein said undesired substances are selected from the group consisting of silicon nitride, siliconoxynitride, silicon dioxide, polysilicon and mixtures thereof.

7. The process of claim 1 wherein said volatile reaction products are monitored to detect an increase in said source of fluorine and said partial clean is terminated when said increase is detected.

8. The process of claim 1 wherein said volatile reaction products are monitored to detect an decrease in silicon tetrafluoride and said partial clean is terminated when said decrease is detected.

9. The process of claim 7 wherein said increase has a magnitude of no greater than 20% by volume.

10. The process of claim 8 wherein said decrease has a magnitude of no greater than 20% by volume.

11. The process of claim 1 wherein the time less than required to completely clean the equipment surfaces is determined by first conducting a clean of undesired substances from the equipment for a time sufficient to completely clean undesired substances from the equipment surfaces and thereafter performing the partial cleaning for the time less than required to completely clean the equipment surfaces.

* * * * *

UNITED STATES PATENT AND TRADEMARK OFFICE
CERTIFICATE OF CORRECTION

PATENT NO. : 5,868,852
DATED : Feb. 9, 1999
INVENTOR(S) : Johnson, et al.

It is certified that error appears in the above-indentified patent and that said Letters Patent is hereby corrected as shown below:

On the title page, item [75], col.1 line 1,

Inventors: add -- R. James Gibson, Gilbert, AZ --.

Signed and Sealed this

Eighteenth Day of May, 1999

Attest:

Q. TODD DICKINSON

*Attesting Officer*     Acting Commissioner of Patents and Trademarks